(12) United States Patent
McKinnon et al.

(10) Patent No.: US 6,788,055 B2
(45) Date of Patent: Sep. 7, 2004

(54) MODULAR TIMEMASKING SEQUENCE PROGRAMMING FOR IMAGING SYSTEM

(75) Inventors: Graeme Colin McKinnon, Hartland, WI (US); Paul Edgar Licato, Wauwatosa, WI (US); Qing Tan, Waukesha, WI (US); Lawrence Edward Ploétz, Brookfield, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/751,312

(22) Filed: Dec. 29, 2000

(65) Prior Publication Data

US 2001/0016782 A1 Aug. 23, 2001

Related U.S. Application Data

(63) Continuation of application No. 09/120,920, filed on Jul. 22, 1998, now Pat. No. 6,249,120.

(51) Int. Cl.$^7$ ................................................ G01V 3/00
(52) U.S. Cl. ...................................... 324/309; 324/307
(58) Field of Search ................................ 324/309, 307, 324/311, 312, 314; 364/200; 371/27

(56) References Cited

U.S. PATENT DOCUMENTS 5,256,967 A * 10/1993 Foo et al. ................... 324/311
5,560,360 A * 10/1996 Filler et al. ............... 128/653.2
6,194,900 B1 * 2/2001 Freeman et al. ............. 324/321
6,249,120 B1 * 6/2001 Mcinnon et al. ............ 324/312
6,356,780 B1 * 3/2002 Likato et al. ................ 600/407
6,522,786 B1 * 2/2003 Cline ......................... 382/257
6,598,011 B1 * 7/2003 Kiritzinsky ................. 702/185

FOREIGN PATENT DOCUMENTS

EP          0 974 881 A2 *  1/2000

* cited by examiner

Primary Examiner—Brij B. Shrivastav
(74) Attorney, Agent, or Firm—Fletcher Yoder (57) ABSTRACT

A technique is described for programming multiple axes or channels of a system, such as an MRI system. Modular component time masks are defined including information for activity on at least one axis and a time boundary for execution of the activity. The modular components may be stored in a library, and assembled to define desired control sequences. Activity may include pulse sequences for coils in the imaging system. The modular components facilitate definition of complex multi-axis control sequences while respecting inherent physical constraints of the system. Time optimized control sequences may be developed from the modular components by reference to beginning and ending times of a series of components, or to anchor time points associated with the components.

61 Claims, 7 Drawing Sheets

MODULAR TIMEMASKING SEQUENCE PROGRAMMING FOR IMAGING SYSTEM

This application is a Continuation of application Ser. No. 09/120,920, filed Jul. 22, 1998 now U.S. Pat. No. 6,249,120.

TECHNICAL FIELD

The present invention relates to imaging systems, such as magnetic resonance imaging systems used in medical applications. More particularly, the invention relates to a technique for programming sequences of events, including controlled parameters for multiple components or axes of an imaging system, useful in acquiring and processing data representative of images in such systems.

BACKGROUND ART

A range of modalities are available for acquiring and constructing images of physical subjects. In the medical imaging field, such modalities include magnetic resonance imaging systems, commonly referred to generically MRI systems. MRI systems generally include magnetic field-generating coils which can be carefully controlled to excite gyromagnetic material in a subject of interest Proper control of a plurality of magnetic field-generating coils, such as field gradient coils, excitation coils, and so forth, permit the gathering of an increasing number of image types, allowing an attending physician or radiologist to concentrate on specific features of interest in the subject. During complex data acquisition sequences in such systems, a large number of precisely controlled pulses may be generated and coordinated with one another to produce the desired fields, and to sense emissions from the subject, typically produced by the exited gyromagnetic material of internal static or dynamic tissues.

In a number of imaging modalities, a large amount of data is acquired through a series of programmed steps. The data acquisition sequences are typically pre-established in software routines stored in a controlling computer system. The attending physician or radiologist selects desired image types or protocols and sets certain parameters employed by the controlling computer during the imaging process. Thereafter, the computer executes a series of steps, typically in repetition, to acquire the image data. In MRI processes, for example, magnetic and radio frequency pulses are typically emitted for a plurality of axes to excite specific volumes of tissue. The pulses are interlaced with acquisition sequences wherein emissions from the tissue are sensed and encoded for later filtering and image reconstruction.

Although at a high level the user of such imaging systems may simply select a particular image type or configuration, the selected configuration includes a large number of parameter control steps which are not necessarily apparent to the user. In MRI systems these include specific axis pulse sequences, such as for orienting magnetic fields, exciting tissues, and acquiring data. Each of these sequences, in turn, includes selections of a variety of parameters, such as pulse duration, pulse amplitude, timing between pulses, and timing of emission detection. Moreover, the image sequences may include coordinated pulse trains which follow one another in a logical manner consistent with the physical constraints of the material being imaged and the modality employed. For example, MRI applications may include pulse trains intended to excite specific locations within a subject, orient fields for slice selection, flip directions of rotation of gyromagnetic material, and so forth. Finally, periods between activity may be programmed, such as to permit settling of equipment or to allow time for processing of signals.

In general, programmers designing specific imaging sequences attempt to coordinate the many parameters of such multi-axis activity in such a way as to reduce the overall image data acquisition time, while avoiding unwanted interactions between the segments of the acquisition sequence which might result in a less useful image. However, while manual configuration of image acquisition sequences has provided a useful array of imaging techniques, it is not without drawbacks. For example, as multi-axis control in MRI and other imaging systems becomes increasingly complex, so does the configuration of the control sequence for the axes and the coordination between sequences of activity on the axes. Moreover, further optimization of image data acquisition is often hampered by the need to foresee complex interactions between axis activity. Failure to anticipate such interactions can result in control of specific parameters in ways that do not render the desired image data or which do not permit appropriate time for data collection or processing.

There is a need, therefore, for an improved technique for defining control sequences in imaging systems, such as MRI systems. In particular, there is a need for a technique for coordinating and optimizing pulse sequences and other activities on multiple axes in an imaging system, and which inherently respects the physics of the image data acquisition process, and avoids unwanted interactions between activities on multiple axes.

DISCLOSURE OF THE INVENTION

The invention provides a technique for controlling an imaging system designed to respond to these needs. The technique is applicable to a variety of imaging modalities, and is particularly well suited to multi-axis control of MRI and similar systems. The technique allows image acquisition sequence definition based on modules of activity, such as multi-axis pulse sequences, data acquisition sequences, and so forth. The activities on the axes are defined by limits or boundaries of the modules, particularly time boundaries, such that the modules can be assembled into combinations which inherently respect the physical constraints of the imaging system, subject, and signal processing circuitry. The system designer can thus optimize control of the system parameters by building a data acquisition sequence based upon the modules. The modules may be represented graphically, further facilitating assembly and optimization of desired control sequences.

In an exemplary implementation a plurality of modules are defined for controlling activity of at least one subsystem or axis of the imaging system. Each module defines controlled parameters and a time frame within which the parameters are controlled. Modules may define multi-parameter control, such as for more than one axis in a multi-axis system, and time frames may be different for the controlled axes. The modules may be defined graphically for presentation on a computer work station or the like. The modules are assembled into sequences by reference to the controlled parameters and the time frames. Graphically, the modules may be juxtaposed to formulate the sequences and to respect inherent constraints of the physical system, the system components and the subject being imaged. Time optimization is particularly facilitated by providing an intuitive reference for the programmer through the use of the modules for various subsequences of interest.

BEST MODE FOR CARRYING OUT THE INVENTION

Figure 1:
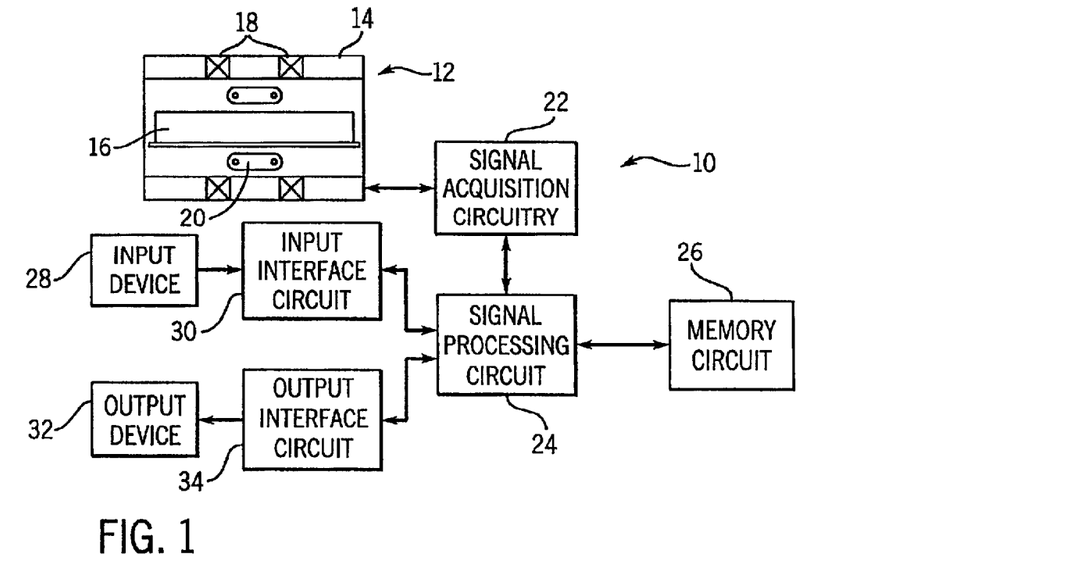
FIG. 1 is a diagrammatical view of a multi-axis imaging system for generating images of a subject of interest.

Referring to FIG. 1, a magnetic resonance imaging system 10 is illustrated as including a scanner 12 coupled to circuitry for acquiring and processing discrete pixel data. Scanner 12 includes a support structure 14 in which a subject 16 may be placed for acquiring images representative of internal features, such as tissues, fluids and so forth. Scanner 12 includes an electromagnet arrangement 18 for producing an electromagnetic fields in a manner generally known in the art, typically including a primary field and a series of gradient fields. Excitation and sensing coils 20 are provided within scanner 12 for exciting gyromagnetic materials within subject 16 and for sensing emissions from the materials.

Signals sensed by coils 20 are encoded to provide digital values representative of the signals emitted at specific locations within the subject, and are transmitted to signal acquisition circuitry 22. Signal acquisition circuitry 22 also provides control signals for configuration and coordination of fields emitted by coils 20 during specific image acquisition sequences. Signal acquisition circuitry 22 transmits the encoded image signals to a signal processing circuit 24. Signal processing circuit 24 executes pre-established control logic routines stored within a memory circuit 26 to filter and condition the signals received from signal acquisition circuitry 22 to provide digital values representative of each pixel in the acquired image. These values are then stored in memory circuit 26 for subsequent processing and display.

Signal processing circuit 24 receives configuration and control commands from an input device 28 via an input interface circuit 30. Input device 28 will typically include an operator's station and keyboard for selectively inputting configuration parameters and for commanding specific image acquisition sequences. Signal processing circuit 24 is also coupled to an output device 32 via an output interface circuit 34. Output device 32 will typically include a monitor or printer for generating reconstituted images based upon the image enhancement processing carried out by circuit 24.

It should be noted that, while in the present discussion reference is made to discrete pixel images generated by a magnetic resonance imaging system, the signal processing and sequence assembly techniques described herein are not limited to any particular imaging modality. Accordingly, these techniques may also be applied to image data acquired by x-ray systems, PET systems, and computer tomography systems, among others. It should also be noted that in the embodiment described, signal processing circuit 24, memory circuit 26, and input and output interface circuits 30 and 34 are included in a programmed digital computer. However, circuitry for carrying out the techniques described herein may be configured as appropriate coding in application-specific microprocessors, analog circuitry, or a combination of digital and analog circuitry.

Figure 2:
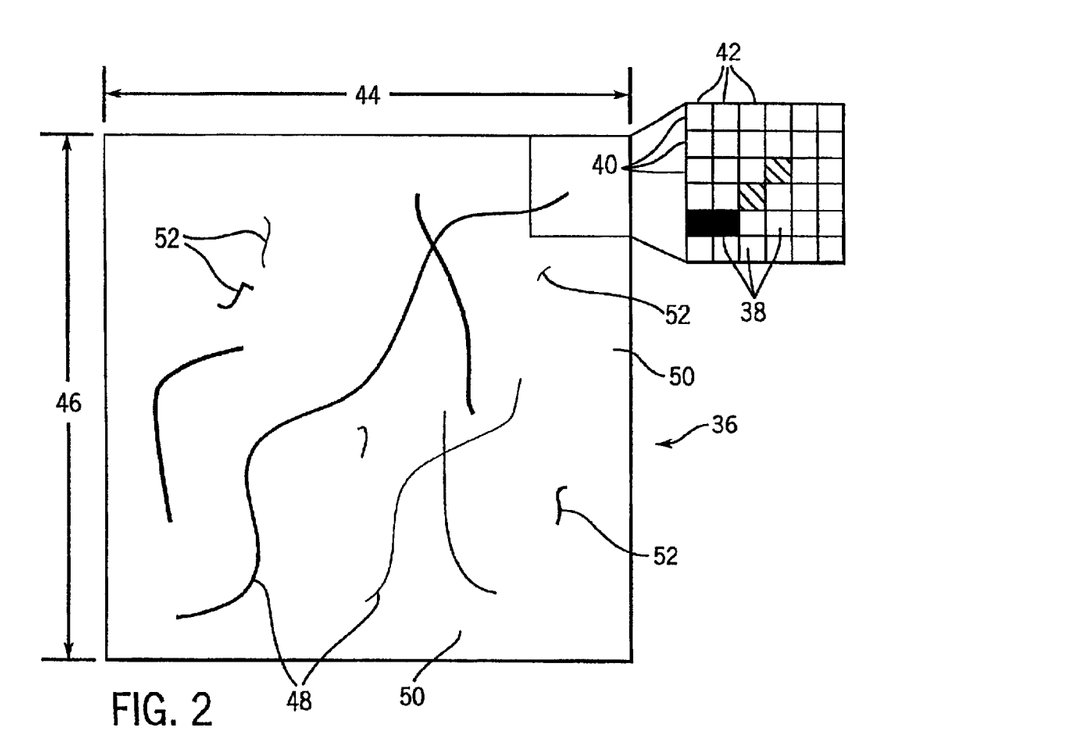
FIG. 2 is a diagrammatical view of an exemplary discrete pixel image produced via the imaging system of FIG. 1.

FIG. 2 illustrates an exemplary discrete pixel image 36 produced via system 10. Image 36 is composed of a matrix of discrete pixels 38 disposed adjacent to one another in a series of rows 40 and columns 42. These rows and columns of pixels provide a preestablished matrix width 44 and matrix height 46. Typical matrix dimensions may include 256×256 pixels; 512×512 pixels; 1,024×1,024 pixels, and so forth. The particular image matrix size may be selected via input device 28 (see FIG. 1) and may vary depending upon such factors as the subject to be imaged and the resolution desired. As illustrated in FIG. 2, image 36 generally represents features of interest 48, illustrated as consisting of long, contiguous lines defined by adjacent pixels. Image 36 also includes textural or background regions 50 surrounding the features of interest, as well as detailed features 52 separate from the major features. Both the features and the surrounding regions represented in the image are defined by data collected in an acquisition sequence in which imaging system 10 generates a series of predetermined pulses programmed through definition of pulse sequence component modules and assembly of the modules as described in greater detail below.

Imaging system 10 executes pre-established control routines for creating a discrete pixel images of the type illustrated in FIG. 2 by means of preestablished pulse sequences in coils of scanner 12. These control routines, executed by signal processing circuit 24 and signal acquisition circuit 22, are stored in memory circuit 26, and include instructions for creating or receiving pulses on various control axes or channels. In particular, magnetic resonance measurement used to generate images by system 10 is implemented by dynamic control of three orthogonal field gradient strengths, a radio frequency (RF) coil, as well as by other special coils (e.g., surface coils). In general, the pulse sequences employed during this process include descriptions of gradient pulses, RF pulses, acquisition periods, and so forth, including specifications for timing of the various pulses and periods, as well as definitions for the magnitude, profile, and frequency of the pulses. In the embodiment illustrated in the figures, programming code representing the pulse sequences is stored as tables of digital waveform values in memory circuit 26. These values, once accessed during an imaging sequence, are sent at predetermined time intervals to gradient field strength and RF amplifiers included in signal acquisition circuitry 22. In addition to the waveform values, a set of control signals are used to set exciter and receiver frequency and phase, to select data acquisition filtering configurations, to provide blanking signals for a receiver, to initiate data collection, and so forth. As will be appreciated by those skilled in the art, such pulse sequences and timing information are established in advance based upon the type of image data to be acquired, the physical characteristics of the subject and those of the controlled machine.

Figure 3:
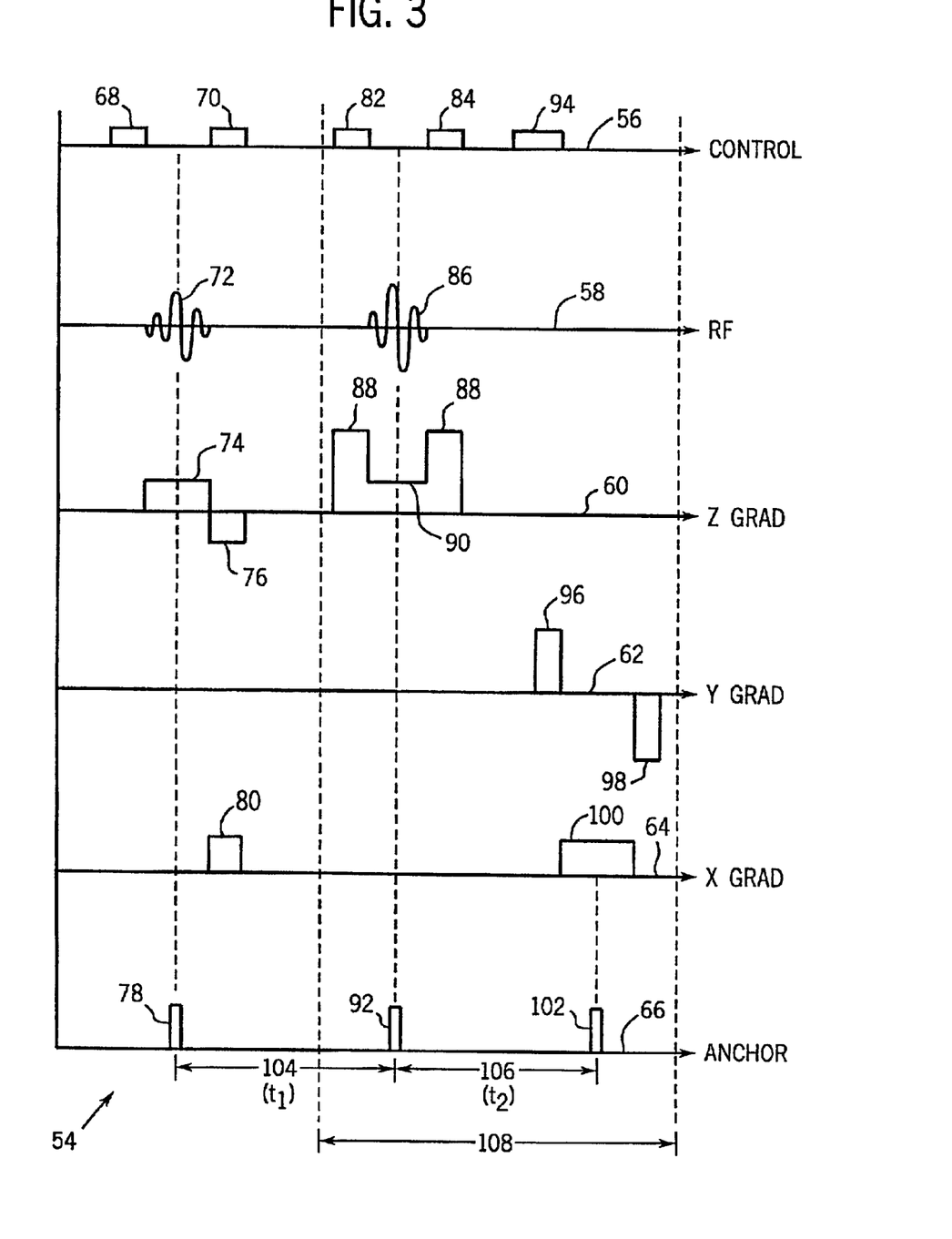
FIG. 3 is a graphical representation of an exemplary sequence of pulses in an image acquisition sequence implemented by the system of FIG. 1.

As illustrated in FIG. 3, a pulse sequence for control of imaging system 10 will generally contain a number of pulses on several channels or axes. In the embodiment illustrated in FIG. 3, a pulse sequence 54 includes pulses on a control axis 56, an RF axis 58, a Z gradient axis 60, a Y gradient axis 62, an X gradient axis 64, and an anchor axis 66. Activity on the various channels or axes may occur at different times, or may overlap in time, the execution time of the various pulses in FIG. 3 being represented in the horizontal direction of each controlled axis. As will be appreciated by those skilled in the art, in an MR imaging process the logical or gradient axis may normally correspond to physical axes of the MR imaging scanner system, or may be translated to rotate the coordinate system in accordance with a desired slice orientation or image region. As will also be appreciated by those skilled in the art, optimization of a pulse sequence, such that imaging time is minimized, generally requires that the pulses comprising the sequence be spaced as closely together as possible, while respecting the physical constraints of the subject and imaging system. In conventional pulse sequence programming techniques, the multiple parameters of each pulse, including the pulse's amplitude, its start time, its completion time, its axis, and its relationship to other pulses, both on other axes and on the same axis, must all be set by the programmer. Failure to respect physical constraints of the system in this process lead to pulse sequences which are physically impossible at a machine level, or which produce meaningless or degraded data due to the physics of the subject or imaging system.

The present technique permits construction of pulse sequence components and their assembly into desired pulse sequences, with physical constraints of the system preferably being accounted for at a lowest or component level. Thus, a pulse sequence of the type illustrated in FIG. 3 and described more fully below, may be constructed from logical pulse components by assembly of such components without direct regard to physical constraints of the system. The technique is described below with reference to a pair of exemplary pulse sequences of the type that may be executed in an MRI system.

In the exemplary pulse sequence of FIG. 3, pulses are created on all axes of the system for a fast spin echo (FSE) measurement in an MR system. In the illustrated pulse sequence, a pre-RF signal 68 is produced on the control axis, followed by a post-RF signal 70. During the period of the pre-RF signal 68, the system hardware initiates receiver blanking, and establishes the RF center frequency and phase. During the period of post-RF signal 70, the system disables the receiver blanking. Between signals 68 and 70 on the control axis, an RF sinc waveform 72 is generated on the RF axis. At the same time, a selective excitation pulse 74 is generated on the Z gradient axis. The selection pulse 74 is followed by a refocus pulse 76 of an opposite orientation, also on the Z gradient axis. The amplitude of the selection gradient will generally depend upon the RF pulse bandwidth, and the desired image slice thickness. The length of this gradient pulse will depend upon the RF sinc pulse length. The RF sinc waveform will generally be centered with respect to the selection gradient as discussed in greater detail below. This centering is insured by an anchor 78 which serves to define a point in time which is the basis for execution of the RF sinc and selection pulses, and the pulses which are required immediately before and after them.

A prephaser pulse 80 is generated on the X gradient axis in preparation for data acquisition. The area defined by this pulse will generally be a function of the readout component discussed below.

Also as shown in FIG. 3, the pulse sequence 54 includes a series of pulses for selective refocusing of the fields used to acquire data for the desired image. Thus, a pre-RF signal 82 and a post-RF signal 84 are generated on the control axis. Between these two signals, an RF sinc pulse 86 is generated on the RF axis. Also, a pair of symmetric crusher gradients 88 as well as a selection gradient 90 are generated on the Z gradient axis. The amplitude of the selection gradient will generally depend upon the RF bandwidth of pulse 86, and on the desired image slice thickness. The length of the gradient pulses will generally be a function of the length of the RF sinc pulse 86. The RF sinc waveform 86 is centered with respect to the selection gradient 90, as indicated by anchor point 92 on the anchor axis. Like anchor point 78, anchor point 92 serves as the basis for locating or positioning the pulses in the selective refocusing group as discussed in greater detail below.

Following pulse 84 on the control axis, an acquisition control waveform 94 is produced on the control axis. A trapezoidal gradient pulse 96 is also produced on the Y gradient axis, the area of which will depend upon the desired field of view and upon the desired Y axis resolution Also on the Y gradient axis, a rewinder pulse 98 is generated of equal duration and amplitude as pulse 96, but opposition in direction. Finally, an FSE acquisition pulse 100 is generated on the X gradient axis immediately following phase encoding pulse 96, and immediately before rewinder pulse 98. The length of pulse 100 will generally depend upon the acquisition period, which is centered with respect to this trapezoidal gradient, as indicated by anchor 102.

By way of the example of FIG. 3, it will be appreciated by those skilled in the art, that the various pulses in sequence 54 are defined and spaced in time with respect to one another to obtain meaningful image data. In general, this timing may be represented by time periods 104 and 106 which represent intervals between anchor points 78 and 92, and anchor points 92 and 102, respectively. Thus, the FSE pulse sequence consists of pulses for selective excitation of gyromagnetic material within subject 16, a pre-phaser pulse, selective refocusing pulses, and data acquisition components. In practice, a portion of the pulse sequence may be replicated a number of times as indicated by reference number 108 in FIG. 3. Thus, the pulses included within the segment 108 may be reproduced depending upon the number of echoes to be acquired in the imaging sequence. In the example, the time between successive refocusing pulse sequences will generally be twice the time 104 separating the anchor points for the excitation and selection RF waveforms.

Figure 4:
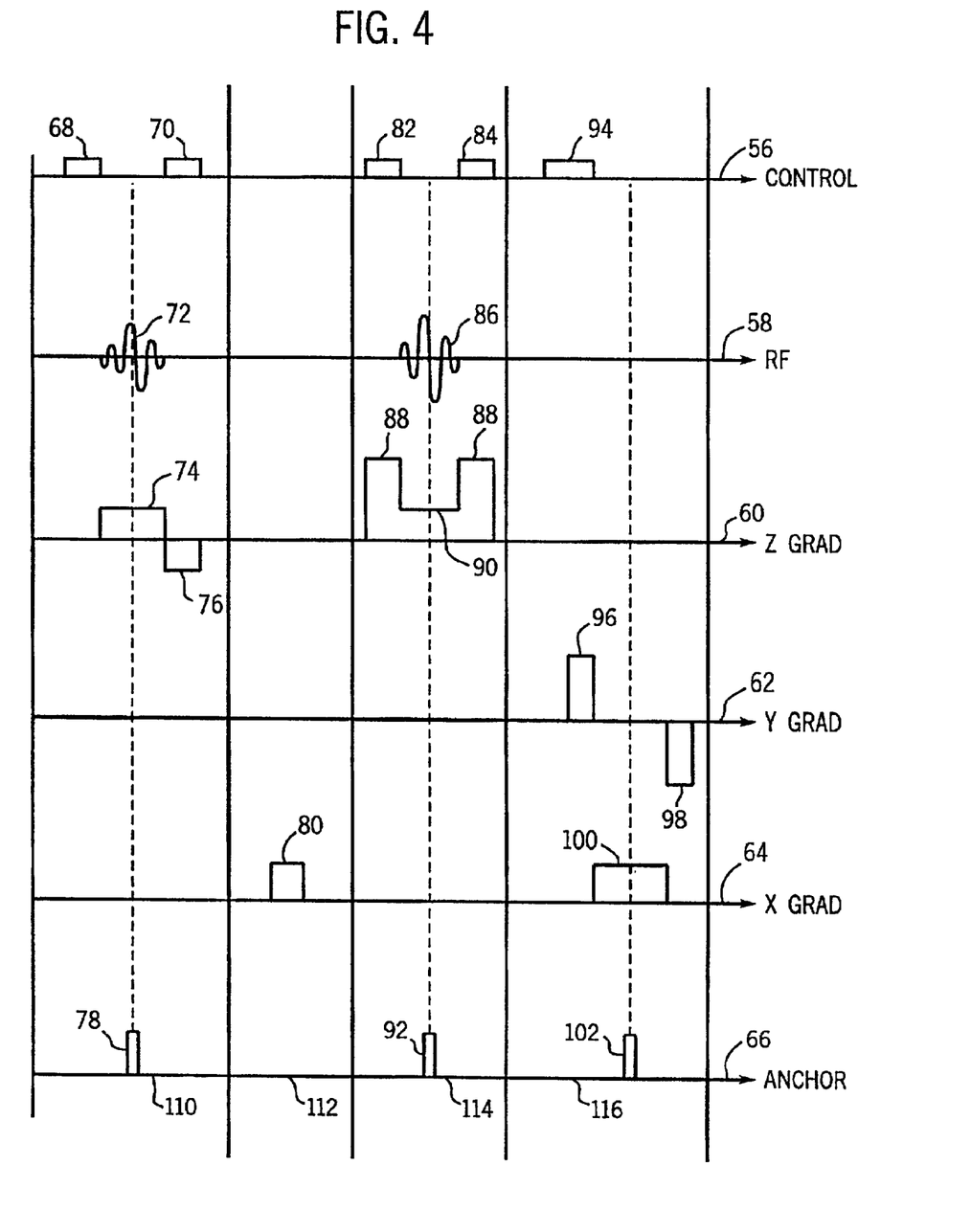
FIG. 4 is a graphical representation of the pulse sequence of FIG. 3, divided into logical component groups.

In accordance with the present technique, programming of parameters for a desired pulse sequence is facilitated by identification of logical relationships between the pulses and by definition of modular components including such pulses. FIG. 4 illustrates the exemplary pulse sequence of FIG. 3, divided into such logical groupings. Thus, as shown in FIG. 4, a first grouping 110 is defined including pulses for selective excitation. Group 10 includes control axis pulses 68 and 70, as well as RF sinc pulse 72, selection and refocus pulses 74 and 76, and anchor 78 defining a center time for the RF sinc and selection gradient waveforms. A second pre-phaser group 112 is defined including a single pulse, namely, pre-phaser pulse 80 on the X gradient axis. A third group 114 includes pulses for selective refocusing. These include control pulses 82 and 84, RF sinc pulse 86, crusher gradient pulses 88, selection gradient 90, as well as anchor 92 defining the center of the RF sinc and gradient pulses. Finally, in the exemplary pulse sequence, a fourth group 116 is defined including FSE acquisition pulses.

Figure 5:
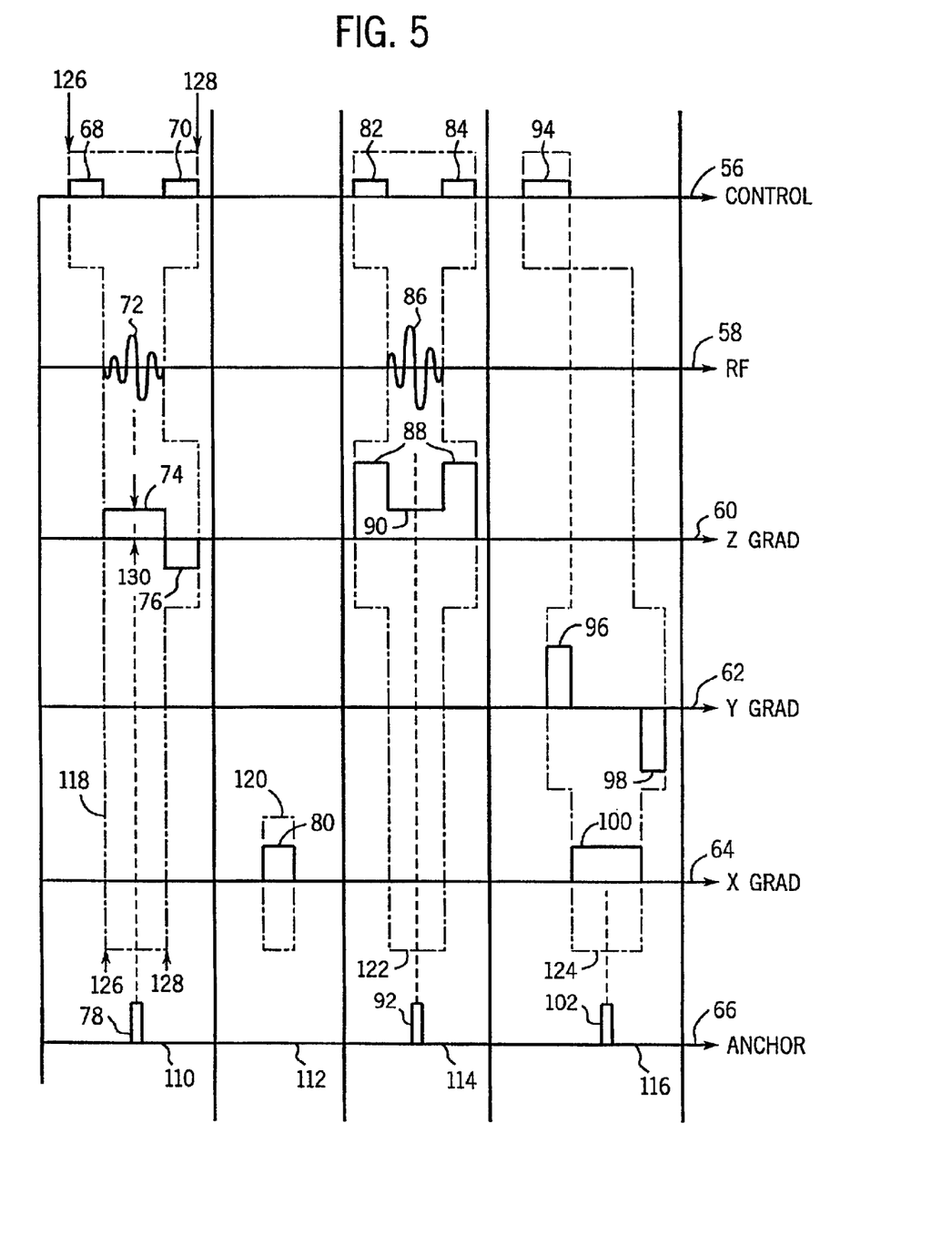
FIG. 5 is a graphical representation of the component modules defined based upon the divisions of FIG. 4.

Following identification of the pulse groups, modular component time masks are defined as illustrated in FIG. 5. Each time mask preferably includes definitions of the pulses comprising the component, and may further define amplitudes, durations, and relative spacings between the pulses. It should be noted also that components as illustrated in FIG. 5 may include time masking for axes other than those on which pulses are actually generated. This is particularly the case where the image acquisition routine would call for one or more axes to remain without activity during certain of the pulses. Moreover, in addition to the axes illustrated and described herein, the components defined in this stage of the technique may include time masks for additional segments of the imaging system. For example, where signal processing circuitry requires additional time for executing filtering or computational functions, components may be defined which ensure sufficient time for such processing. Similarly, where elements of the imaging system require specific known settling times, data retrievable times, and the like, these may be additionally defined in the time masks.

Returning to FIG. 5, time masks or pulse components are defined based upon the groupings identified in the pulse sequence. Thus, a selective excitation component 118 is defined including the pulses identified in the selective excitation group 110 of FIG. 4. As noted above, this component also identifies a time mask for the X gradient and Y gradient axes during which no activity should be scheduled for these axes. A pre-phaser component 120 is also defined including only the pre-phaser pulse 80. As illustrated, due to the nature of the pre-phaser pulse, no constraint regarding activity on other axes is applicable. A selective refocusing component 122 is defined including the pulses identified in selective refocusing group 114 of FIG. 4. As in the case of the selective excitation component, this component includes masking of the X gradient and Y gradient axes during the period of RF sinc pulse 86 and gradient selection pulse 90. Finally, an FSE acquisition component 124 is defined including the pulses identified in the FSE acquisition group 116 of FIG. 4. This component includes time masking for waveforms on the Y and X' gradient axes, and for reserving the RF and Z gradient axes. The FSE acquisition component 124 also includes acquisition control signal 94 which is offset with respect to the time mask for the RF and Z gradient axes. It should also be noted that each of the components associated with a time anchor maintains the respective anchor in the component definition. Thus, component 118 maintains time anchor 78, component 122 maintains anchor 92, and component 124 maintains anchor 102.

In a preferred embodiment, a multitude of modular pulse components may be generated and stored for future use in defining desired pulse sequences. Each component may not only define the types of pulses desired, as well as the axes of the pulses, but may define start times, end times, anchor points, amplitudes and directions of the individual pulses. Certain of these parameters may be adjustable by the programmer without the need to redefine a separate component. For example, as illustrated in FIG. 5, selective excitation component 118 defines a start time or boundary 126 which begins for a certain axes at a time corresponding to the onset of waveform 72 and pulse 74, while beginning for other axes (i.e., control axis 56 in the embodiment illustrated) at an earlier time. Similarly, component 118 defines an end time 128 which occurs at predetermined times spaced from beginning time 126 by the same or different durations for various axes. Thus, in the illustrated embodiment, end time 128 defines a time boundary for the Y gradient and X gradient axes corresponding to the ending time of RF sinc waveform 72 and pulse 74. The ending boundary of the time mask occurs at a later time for the control and Z gradient axes. In addition, each component may define the start and end times based upon spacings from an anchor point such as anchor point 78 in the case of component 118. The definitions of beginning and ending times, and their reference to one another as well as to anchor points 78 facilitate time placement and time optimization of the components. In addition to the timing boundaries for each component, each component may include alterable parameters such as pulse amplitudes, as indicated by amplitude 130 for selection gradient pulse 74.

Figure 6:
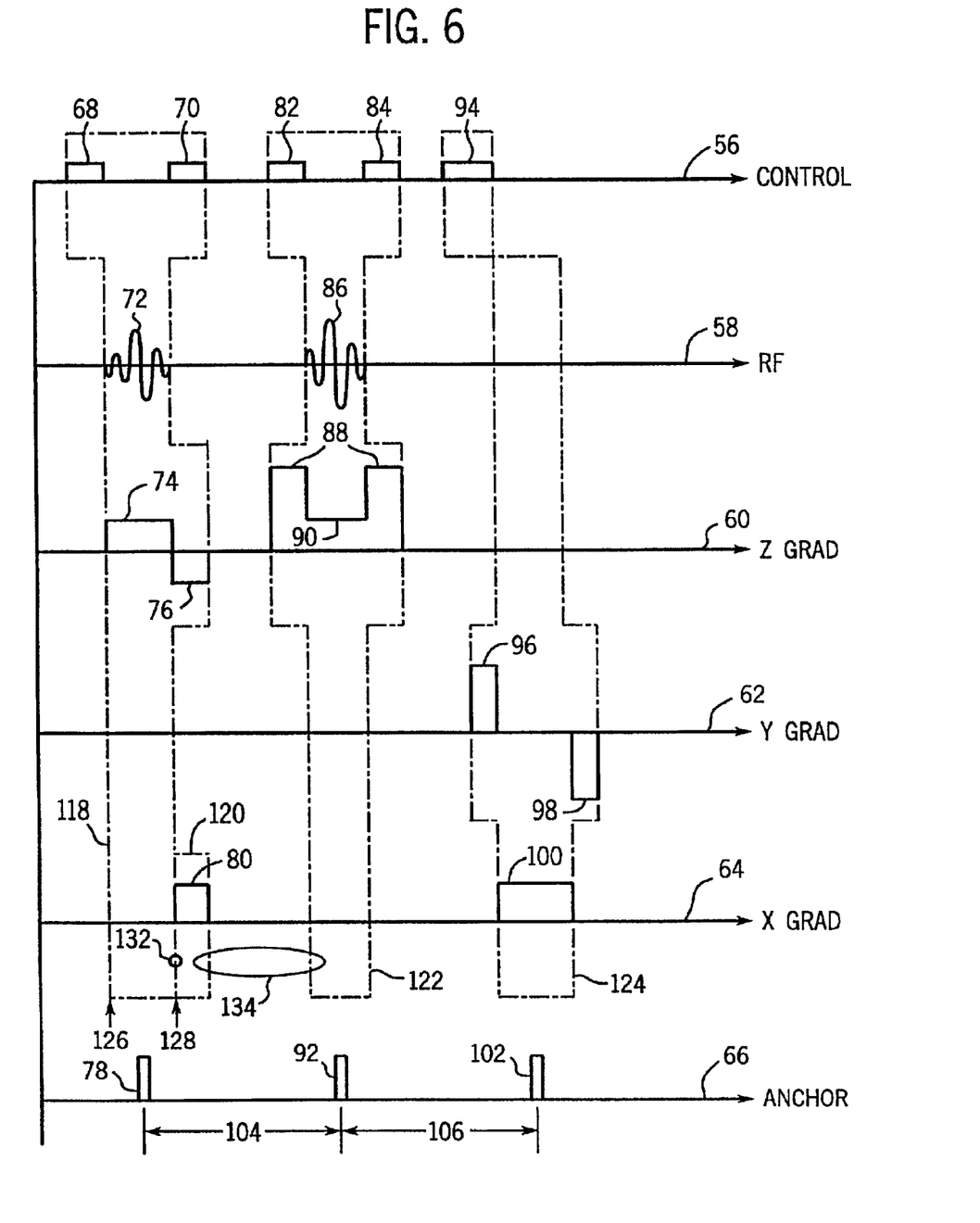
FIG. 6 is a graphical representation of the component modules of FIG. 5 assembled to produce a pulse sequence of the type shown in FIG. 3.

Following definition of the modular pulse components, the components may be selected and assembled to define larger pulse sequences. FIG. 6 illustrates the assemblage of the components defined in FIG. 5, to reconstitute a pulse sequence of the type illustrated in FIG. 3. Thus, as shown in FIG. 6, in a first type of assembly, pulse components may be packed so as to optimize the overall time required for their execution. In particular, in the illustrated embodiment, prephaser component 120 is positioned immediately adjacent to selective excitation component 118. This may be accomplished by setting a beginning time for component 120 equal to or slightly after an ending time for component 118, such that the components share a time boundary as indicated at reference numeral 132. In this manner, components may be stacked in time to facilitate definition of beginning times for later components based upon ending times for preceding components. In a second type of assembly, components may be positioned relative to one another based upon time offsets between beginning and ending times, between beginning times, between ending times, or between anchor points. For example, as illustrated in FIG. 6, component 122 is positioned with respect to component 118 by appropriate spacing of anchor point 92 from anchor point 78 as indicated by reference numeral 104. The resulting assembly produces time boundaries which are spaced apart from one another as indicated by reference numeral 134, but which, nevertheless, represent an optimal or desired spacing of the pulses of each component, such as for desired echo times. Thus, the technique offers the facility of predefining pulse components, which may be included in a library for anticipated future use. The technique also facilitates masking of both axes including pulse activity, as well as axes on which no activity should take place. Moreover, the technique facilitates time optimization and time placement of pulses, reducing the need for the pulse sequence programmer to independently define starting and ending times for the multiple pulses in particular pulse sequences independent of one another.

Figure 7:
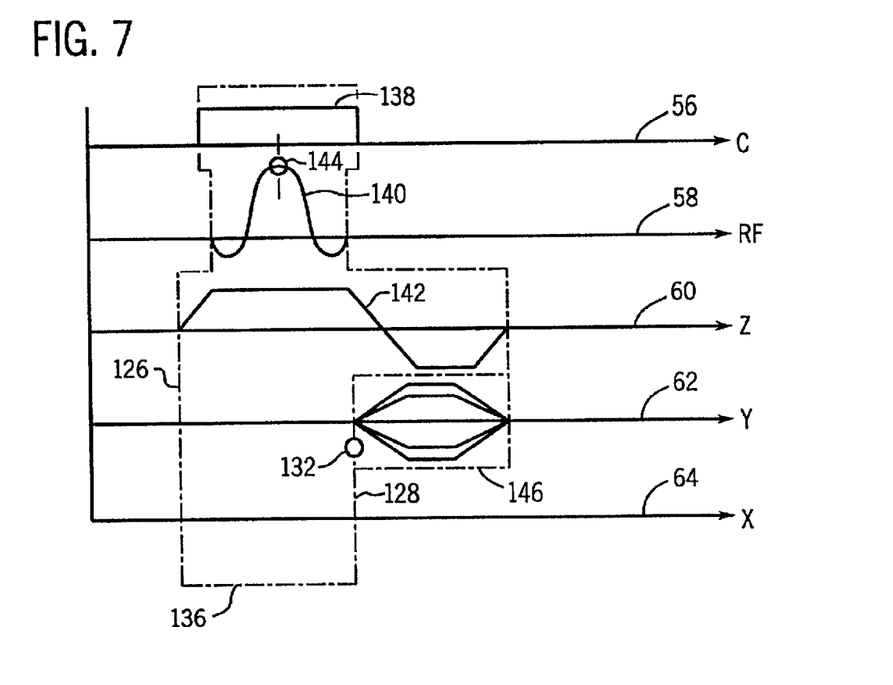
FIGS. 7, 8, 9 and 10 are graphical representations of another exemplary pulse sequence and assembly of modular components for defining the pulse sequence.

The component definition and time optimization features of the technique are further illustrated in another exemplary embodiment as shown in FIGS. 7, 8, 9, and 10. In those figures, rather than presenting the anchor points described above as a separate control axis or channel, these are represented in the figures as integral elements or parameters of the pulse components. As illustrated in FIG. 7, in this exemplary embodiment, a slice selection component 136 is defined including time masks for control, RF, Z gradient, Y gradient and X gradient axes. The slice selection component 136 thus includes a control pulse 138, as well an RF pulse 140. A trapezoidal Z axis pulse 142 includes positive and negative amplitude waveforms in succession. Time masks are also defined by beginning time boundary 126 and ending time boundary 128 of the component preventing activity on the Y gradient and X gradient axes during the period of component 136. An anchor point 144 is defined for component 136 as a center point of RF waveform 140.

Also illustrated in FIG. 7 is a phase encoding component 146. This component includes waveforms for the Y gradient axis. Because the component does not require time masking of any other controlled axis, it may be positioned in a time-optimized manner immediately subsequent to slice selection component 136, such that the two components share a time boundary as indicated at reference numeral 132.

Figure 8:
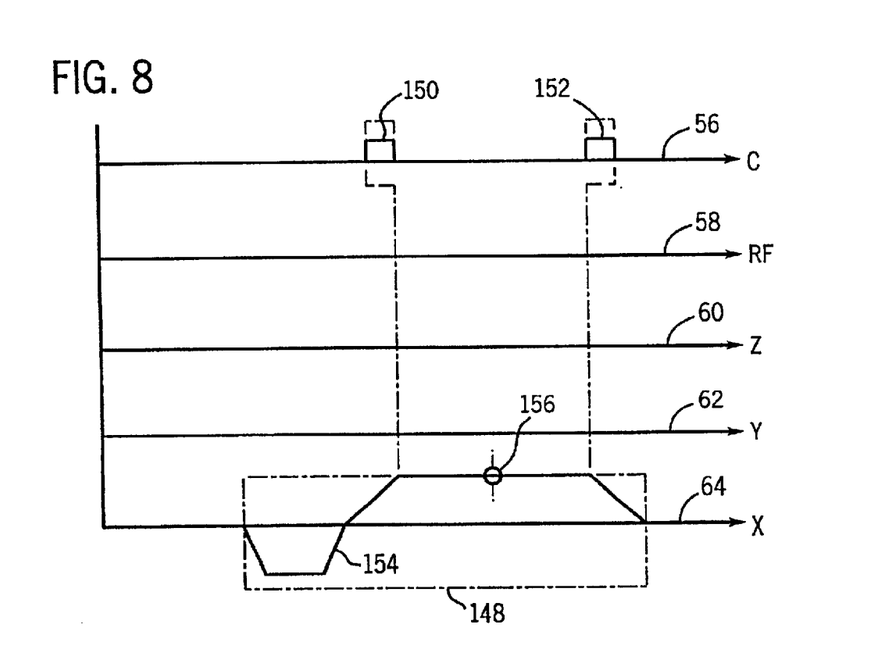

FIG. 8 illustrates an additional pulse component which may be predefined for combination with the components of FIG. 7. The exemplary component of FIG. 8 constitutes a readout acquisition component 148, including control pulses 150 and 152, and an X axis trapezoidal gradient waveform 154. Time boundaries for component 148 mask the RF, Z gradient and Y gradient axes during a portion of the X gradient waveform. In addition, an anchor point 156 is specified on a center point of a positive amplitude portion of waveform 154.

Figure 9:
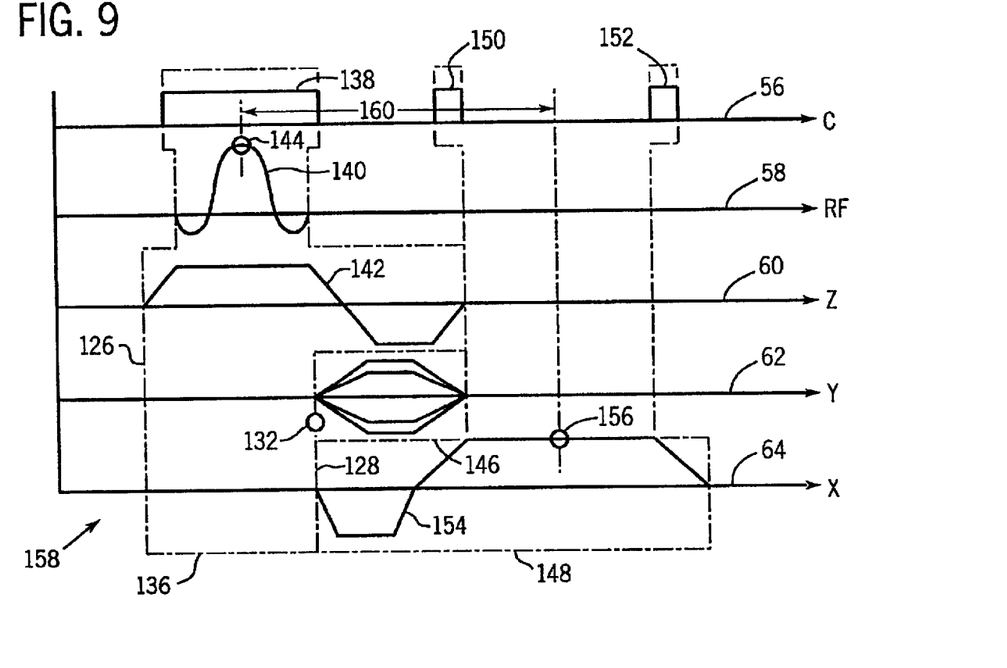
Figure 10:
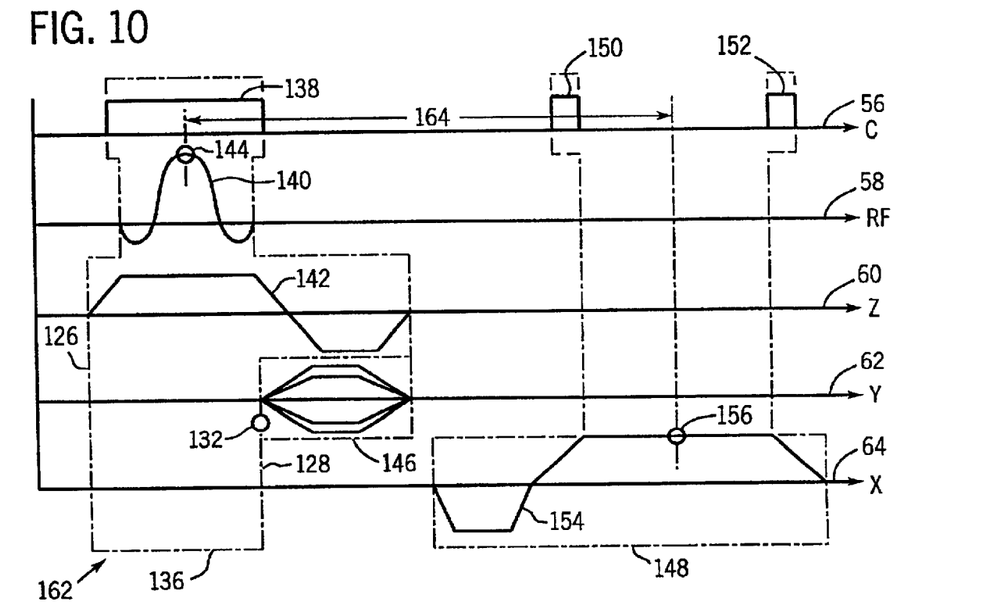

FIGS. 9 and 10 illustrate two different types of combination which can be made of the components of FIGS. 7 and 8. Specifically, FIG. 9 represents a time-optimized combination of the components, such as may be generated by setting an echo time value equal to a minimum or zero. The combination results in compressing the components into a time-optimized compression, such that all time boundaries are immediately consecutive, and a time spacing between anchor points 144 and 156 becomes a minimum time as indicated at reference numeral 160. As shown in FIG. 10, the components may be alternatively combined so as to space them a desired time delay from one another as indicated in the anchored configuration 162 of FIG. 10. In this configuration, the same components are combined, but readout acquisition component 148, including its pulse sequences, is spaced from slice selection component 136 by a desired time period 164 as referenced between anchor points 144 and 156.

In addition to the functions described above for definition and combination of the individual pulse components, in a present embodiment, components may be recombined to form larger component or component combinations, which may be scheduled as blocks. Thus, returning to FIG. 3, depending upon the number or echoes to be acquired in the exemplary pulse sequence, a series of pulses as indicated as reference numeral 108 may be replicated. The present technique facilitates such replication. For example, once the components are defined and assembled as illustrated in FIG. 6, components 122 and 124 may be redefined into a composite component including all of the pulses of the two base components, and the relative time spacing therebetween. Thereafter, replication of the entire pulse sequence may be accomplished by placement of the combined components a desired number of times.

While reference is made in the foregoing description to pulse sequences to be implemented on multiple axes of a magnetic resonance imaging system, other imaging modalities may benefit from the component programming technique described above. Similarly, while certain exemplary pulse sequences are described above, in magnetic resonance imaging systems, a great variety of such pulses and pulse sequences may be programmed in the foregoing manner. For example, these may include slice selective excitation components, slice selective radio frequency components, readout and acquisition components, phase encoding components (including flow compensation and phase contrast, for example) spin preparation pulses, saturation pulses, and so forth.

What is claimed is:

1. A method for configuring a control sequence in an imaging system including a plurality of independently controllable subsystems, and control circuitry for commanding activities of the subsystems, the method comprising the steps of:
   defining a component module including instructions for executing an activity of at least one subsystem and a time boundary for execution of the activity;
   integrating the component module into a control sequence; and
   coordinating at least a portion of the control sequence based on the time boundary.

2. The method of claim 1, wherein the at least one subsystem includes a coil set for producing a magnetic field in a subject of interest.

3. The method of claim 2, wherein defining the component module comprises providing instructions for producing a desired pulse in the coil set.

4. The method of claim 3, wherein defining the component module comprises time masking the desired pulse to prevent activity temporally conflicting with the desired pulse.

5. The method of claim 1, wherein defining the component module comprises time masking activities of a plurality of components.

6. The method of claim 5, wherein time masking comprises simultaneously time masking independent activities of the plurality of components over at least one activity interval.

7. The method of claim 1, wherein defining the component module comprises providing instructions for defining leading and trailing edges of the time boundary.

8. The method of claim 1, wherein defining the component module comprises facilitating user control of the duration of the time boundary.

9. The method of claim 1, wherein integrating the component module comprises coordinating the time boundary with independent activities and adjusting time gaps between at least a portion of the independent activities based on the time boundary.

10. The method of claim 1, comprising time optimizing acquisition of image data.

11. An image produced by the method of claim 1.

12. A method for configuring a control sequence in an imaging system including a plurality of independently controllable subsystems, and control circuitry for commanding activities of the subsystems, the method comprising the steps of:
   defining a component module including instructions for executing an activity of at least one subsystem and a time boundary for execution of the activity, including time masking the desired pulse to prevent activity temporally conflicting with the activity;
   integrating the component module into a control sequence; and
   coordinating at least a portion of the control sequence based on the time boundary.

13. The method of claim 12, wherein the at least one subsystem includes a coil set for producing a magnetic field in a subject of interest.

14. The method of claim 13, wherein defining the component module comprises providing instructions for producing a desired pulse in the coil set.

15. The method of claim 12, wherein defining the component module comprises time masking activities of a plurality of components.

16. The method of claim 15, wherein time masking comprises simultaneously time masking independent activities of the plurality of components over at least one activity interval.

17. The method of claim 12, wherein defining the component module comprises providing instructions for defining leading and trailing edges of the time boundary.

18. The method of claim 12, wherein defining the component module comprises facilitating user control of the duration of the time boundary.

19. The method of claim 12, wherein integrating the component module comprises coordinating the time boundary with independent activities and adjusting time gaps between at least a portion of the independent activities based on the time boundary.

20. The method of claim 12, comprising time optimizing acquisition of image data.

21. An image produced by the method of claim 12.

22. A method for configuring a control sequence in an imaging system including a plurality of independently controllable subsystems, and control circuitry for commanding activities of the subsystems, the method comprising the steps of:
defining a component module including instructions for executing an activity of at least one subsystem and a time boundary for execution of the activity, including time masking activities of a plurality of components;
integrating the component module into a control sequence; and
coordinating at least a portion of the control sequence based on the time boundary.

23. The method of claim 22, wherein the at least one subsystem includes a coil set for producing a magnetic field in a subject of interest.

24. The method of claim 23, wherein defining the component module comprises providing instructions for producing a desired pulse in the coil set.

25. The method of claim 24, wherein defining the component module comprises time masking the desired pulse to prevent activity temporally conflicting with the desired pulse.

26. The method of claim 22, wherein time masking comprises simultaneously time masking independent activities of the plurality of components over at least one activity interval.

27. The method of claim 22, wherein defining the component module comprises providing instructions for defining leading and trailing edges of the time boundary.

28. The method of claim 22, wherein defining the component module comprises facilitating user control of the duration of the time boundary.

29. The method of claim 22, wherein integrating the component module comprises coordinating the time boundary with independent activities and adjusting time gaps between at least a portion of the independent activities based on the time boundary.

30. The method of claim 29, comprising time optimizing acquisition of image data.

31. An image produced by the method of claim 22.

32. A method for configuring a control sequence in an imaging system including a plurality of independently controllable subsystems, and control circuitry for commanding activities of the subsystems, the method comprising the steps of:
defining a component module including instructions for executing an activity of at least one subsystem and a time boundary for execution of the activity, including simultaneously time masking independent activities of a plurality of components over at least one activity interval;
integrating the component module into a control sequence; and
coordinating at least a portion of the control sequence based on the time boundary.

33. The method of claim 32, wherein the at least one subsystem includes a coil set for producing a magnetic field in a subject of interest.

34. The method of claim 33, wherein defining the component module comprises providing instructions for producing a desired pulse in the coil set.

35. The method of claim 34, wherein defining the component module comprises time masking the desired pulse to prevent activity temporally conflicting with the desired pulse.

36. The method of claim 32, wherein defining the component module comprises providing instructions for defining leading and trailing edges of the time boundary.

37. The method of claim 32, wherein defining the component module comprises facilitating user control of the duration of the time boundary.

38. The method of claim 32, wherein integrating the component module comprises coordinating the time boundary with independent activities and adjusting time gaps between at least a portion of the independent activities based on the time boundary.

39. The method of claim 32, comprising time optimizing acquisition of image data.

40. An image produced by the method of claim 32.

41. A method for configuring a control sequence in an imaging system including a plurality of independently controllable subsystems, and control circuitry for commanding activities of the subsystems, the method comprising the steps of:
defining a component module including instructions for executing an activity of at least one subsystem and a time boundary for execution of the activity, including providing instructions for defining leading and trailing edges of the time boundary;
integrating the component module into a control sequence; and
coordinating at least a portion of the control sequence based on the time boundary.

42. The method of claim 41, wherein the at least one subsystem includes a coil set for producing a magnetic field in a subject of interest.

43. The method of claim 42, wherein defining the component module comprises providing instructions for producing a desired pulse in the coil set.

44. The method of claim 43, wherein defining the component module comprises time masking the desired pulse to prevent activity temporally conflicting with the desired pulse.

45. The method of claim 41, wherein defining the component module comprises time masking activities of a plurality of components.

46. The method of claim 45, wherein time masking comprises simultaneously time masking independent activities of the plurality of components over at least one activity interval.

47. The method of claim 41, wherein defining the component module comprises facilitating user control of the duration of the time boundary.

48. The method of claim 41, wherein integrating the component module comprises coordinating the time boundary with independent activities and adjusting time gaps between at least a portion of the independent activities based on the time boundary.

49. The method of claim 41, comprising time optimizing acquisition of image data.

50. An image produced by the method of claim 41.

51. A method for configuring a control sequence in an imaging system including a plurality of independently controllable subsystems, and control circuitry for commanding activities of the subsystems, the method comprising the steps of:
defining a component module including instructions for executing an activity of at least one subsystem and a time boundary for execution of the activity;

integrating the component module into a control sequence, including coordinating the time boundary with independent activities and adjusting time gaps between at least a portion of the independent activities based on the time boundary; and coordinating at least a portion of the control sequence based on the time boundary.

52. The method of claim 51, wherein the at least one subsystem includes a coil set for producing a magnetic field in a subject of interest.

53. The method of claim 52, wherein defining the component module comprises providing instructions for producing a desired pulse in the coil set.

54. The method of claim 53, wherein defining the component module comprises time masking the desired pulse to prevent activity temporally conflicting with the desired pulse.

55. The method of claim 51, wherein defining the component module comprises time masking activities of a plurality of components.

56. The method of claim 55, wherein time masking comprises simultaneously time masking independent activities of the plurality of components over at least one activity interval.

57. The method of claim 51, wherein defining the component module comprises providing instructions for defining leading and trailing edges of the time boundary.

58. The method of claim 51, wherein defining the component module comprises facilitating user control of the duration of the time boundary.

59. The method of claim 51, wherein integrating the component module comprises coordinating the time boundary with independent activities and adjusting time gaps between at least a portion of the independent activities based on the time boundary.

60. The method of claim 51, comprising time optimizing acquisition of image data.

61. An image produced by the method of claim 51.

* * * * *